United States Patent
Crema

(10) Patent No.: US 9,461,011 B2
(45) Date of Patent: Oct. 4, 2016

(54) METHOD AND APPARATUS FOR MANUFACTURING LEAD FRAMES

(71) Applicant: STMICROELECTRONICS S.R.L., Agrate Brianza (IT)

(72) Inventor: Paolo Crema, Vimercate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 205 days.

(21) Appl. No.: 14/079,457

(22) Filed: Nov. 13, 2013

(65) Prior Publication Data

US 2014/0065296 A1    Mar. 6, 2014

Related U.S. Application Data

(63) Continuation-in-part of application No. PCT/EP2012/001928, filed on Apr. 5, 2012.

(30) Foreign Application Priority Data

May 13, 2011  (IT) ................ VI2011A0122

(51) Int. Cl.
    *B05D 5/12*     (2006.01)
    *H01L 23/00*    (2006.01)
    *H01L 21/48*    (2006.01)

(52) U.S. Cl.
    CPC .......... *H01L 24/43* (2013.01); *H01L 21/4821* (2013.01); *H01L 2224/43* (2013.01); *H01L 2924/00014* (2013.01); *H01L 2924/12042* (2013.01); *H01L 2924/15747* (2013.01)

(58) Field of Classification Search
    USPC ......................................................... 427/58
    See application file for complete search history.

(56) References Cited

U.S. PATENT DOCUMENTS

| | | | |
|---|---|---|---|
| 4,877,644 A | 10/1989 | Wu et al. | |
| 4,937,097 A * | 6/1990 | Ichinose | B41F 15/0818 101/123 |
| 6,034,422 A * | 3/2000 | Horita | H01L 23/49582 257/666 |
| 7,064,008 B2 | 6/2006 | Abbott et al. | |
| 7,156,945 B2 * | 1/2007 | Chaug | B32B 38/10 156/701 |
| 7,504,712 B2 | 3/2009 | Martin et al. | |
| 2003/0016283 A1 * | 1/2003 | Leskanic | B41C 1/145 347/225 |
| 2003/0091751 A1 * | 5/2003 | Tsuruta | G06K 19/07749 427/487 |
| 2003/0153129 A1 | 8/2003 | Abbott | |
| 2010/0260940 A1 * | 10/2010 | McCown | C23C 4/08 427/455 |
| 2010/0330504 A1 * | 12/2010 | Irisawa | G03F 7/093 430/313 |
| 2012/0055355 A1 * | 3/2012 | Li | B41F 15/0818 101/123 |

FOREIGN PATENT DOCUMENTS

| | | |
|---|---|---|
| CN | 101713088 A | 5/2010 |
| EP | 0335608 | 6/1995 |
| GB | 2333742 | 8/1999 |
| JP | 56-58252 A | 5/1981 |
| JP | 60225453 | 11/1985 |
| JP | 5-121618 A | 5/1993 |
| JP | 06022543 | 1/1994 |
| JP | 08046113 | 2/1996 |
| WO | 0052231 | 9/2000 |
| WO | 2012156034 | 11/2012 |

OTHER PUBLICATIONS

International Search Report for PCT application No. PCT/EP2012/001928; Rijswijk, Holland, Aug. 1, 2012; 4 pages.

* cited by examiner

*Primary Examiner* — Austin Murata
(74) *Attorney, Agent, or Firm* — Seed IP Law Group PLLC

(57) ABSTRACT

An embodiment of a method and an apparatus for manufacturing lead frames are described. For example, a coating layer is formed on one or more predefined portions of the surface of the substrate of the lead frame by delimiting the predefined portions by means of screen printing. The employment of screen printing may allow obtaining large amounts of lead frames with excellent electronic and structural properties in a quick and cost-effective way.

21 Claims, 4 Drawing Sheets

METHOD AND APPARATUS FOR MANUFACTURING LEAD FRAMES

PRIORITY CLAIM

The present application is a Continuation in Part of copending International Patent Application Serial No. PCT/EP2012/001928, filed Apr. 5, 2012; which claims the benefit of Italian Patent Application Serial No. VI2011A000122, filed May 13, 2011, all of the foregoing applications are incorporated herein by reference in their entireties.

TECHNICAL FIELD

An embodiment relates to the field of integrated circuits. In particular, an embodiment relates to the manufacturing process of lead frames for integrated circuits. Yet more specifically, an embodiment concerns a method and an apparatus for manufacturing lead frames by means of screen printing.

BACKGROUND

One of the main problems when fabricating lead frames for integrated circuits concerns the need for optimizing system performances while, at the same time, reducing or, at least restraining, production costs.

Lead frames consist of a metal substrate, also known as base metal, usually covered with one or more covering metal layers.

The substrate is usually made of copper, copper alloys, steel, iron and nickel alloys, or nickel and steel alloys (invar). The substrate is produced by a metal sheet, which is patterned by means of punching, cutting or chemical etching, so as to form the components of the lead frames such as the conducting segments and the area for housing the semiconductor devices. These semiconductor devices are then electrically coupled to the conducting elements by means of wire bonding, and are mechanically mounted onto the housing area of the system by means of encapsulation with plastic materials or resins.

Lead frames typically have thus to guarantee both high solderability for implementing electrical connections, and optimal adhesion to the encapsulating material that encloses the semiconductor devices.

It has been observed that, at least sometimes, the substrate is not able to possess these properties. For instance, in the case of a copper substrate, formation of corrosion products such as oxides or sulphides on the substrate surface has been observed. The presence of these corrosion products deteriorates the substrate solderability.

For this reason, the idea of plating the substrate with one or more covering metal layers has been put forward, so as to guarantee clear areas with excellent and stable solderability. In particular, precious metals such as palladium, silver, and gold have been used for forming coating layers with high and stable solderability. Examples of such structures for lead frames can be found in EP0335608B1, which is incorporated by reference.

However, using these precious metals for coating the substrate has caused the cost of lead frames to increase dramatically. In particular, coating the entire surface of the substrate of lead frames with one or more layers of precious metals, such as palladium or gold, requires considerable amounts of such metals.

In order to overcome this problem, a procedure for selectively depositing the coating layers (selective plating) has been suggested. In particular, due to this approach, the coating layers of precious metal are deposited only on predetermined areas of the substrate, so as to reduce the system surface occupied by precious metals, while guaranteeing high solderability only in those areas which are actually designed for bonding, for example only at the end of the conduction means. This enables up to 60%-75% saving of precious metal used with respect to the configuration with total coating. An example of a configuration wherein palladium is selectively deposited in predetermined areas of the substrate can be found in U.S. Pat. No. 7,064,008B2, which is incorporated by reference. A further example can be found in U.S. Pat. No. 7,504,712B2, which is also incorporated by reference.

Although the selective plating of precious metals has enabled a reduction in lead-frame manufacturing costs, since the amount of precious metals used has been reduced, the methods used so far for implementing the selective plating may display several disadvantages and problems.

One of the methods initially used for implementing the selective plating of precious metals is based on mechanical screening systems (for example metal masks) adapted to screen those substrate areas which do not have to be coated with precious metals and, thus, to leave those areas which have to be coated with precious metals free (i.e., exposed). However, by using these mechanical masks, a high degree of precision typically cannot be guaranteed, since the precious metals that are deposited by plating are likely to leak through the gaps which may inevitably form between the mask and the substrate. This causes both the plating to be inaccurately implemented and the precious metals to be wasted.

Moreover, using mechanical masks carries the risk of damaging the lead frame substrate owing to the pressure exerted by the mask on the substrate.

In order to overcome problems arising from using mechanical masks, the proposal has been put forward to produce masks made of a photoresist and to use laser light for exposing those substrate areas upon which the coating layers have to be selectively deposited. An example of such a solution can be found in U.S. Pat. No. 4,877,644A, which is incorporated by reference.

However, using photoresists is costly, since these materials are costly. Furthermore, the procedure for removing the photoresist from the predetermined areas in which the plating is performed is lengthy and slow and, thus, it considerably slows down the speed of lead frame manufacturing. Furthermore, in these techniques, the relative motion between the laser beam and the photoresist-covered-substrate is achieved by moving the substrate and keeping the direction of the laser beam fixed. Due to this reason, this method cannot be used for producing lead frames according to reel-to-reel or strip-to-strip processes.

In order to obviate these problems, in WO 00/52231, which is incorporated by reference, the option of using low-cost electrophoretic materials for implementing the mask has been proposed. According to WO 00/52231, the layer of electrophoretic material is selectively removed by driving a laser beam with wavelength of approximately 400 nanometers (nm) to 1200 nm across the surface by means of an optical galvo system. The method described in WO 00/52231 is nevertheless slow and decreases the speed of production of lead frames.

SUMMARY

In an embodiment, a method for manufacturing lead frames is able to overcome at least some of the problems outlined above. In particular, an embodiment of a method for manufacturing lead frames guarantees optimal properties of the lead frames produced, while being fast and cost-effective, so as to reduce lead-frame manufacturing costs and to increase their manufacturing speed.

An embodiment concerns a method and an apparatus for manufacturing lead frames. An embodiment is based on the idea of using screen printing for manufacturing lead frames. In particular, an embodiment is based on the idea of delimiting by means of screen printing those predefined areas of the substrate which are to be plated. This allows for providing lead frames with optimal properties in an effective and economical way.

According to an embodiment, a method is provided for manufacturing lead frames including a metal substrate, wherein the method includes the formation of at least one coating layer on one or more predetermined portions of the surface of the substrate, and wherein the formation of at least one coating layer on one or more predetermined portions of the surface of the substrate includes the delimitation of said one or more predetermined portions by means of screen printing. Using screen printing for delimiting predetermined portions of the surface upon which the coating layer is deposited allows for considerably speeding up the lead-frame manufacturing process and for reducing manufacturing costs, since the materials used for screen printing are not costly.

According to a further embodiment, a method for manufacturing lead frames is provided wherein screen printing includes rotary screen printing. Rotary screen printing allows for further speeding up and facilitating the lead frame manufacturing process.

According to a further embodiment, a method for manufacturing lead frames is provided wherein screen printing includes the following steps: formation of a screen printing mesh including a plurality of holes; and occlusion of one or more holes of the screen printing mesh so that the screen printing ink is allowed to come out through the screen printing mesh and cover the substrate so as to leave said one or more predetermined portions of the surface of the substrate exposed. The screen printing mesh can include a plurality of holes. For example, the screen printing mesh can include a plurality of holes with the same shape and/or dimension. The holes can have a hexagonal shape. The holes can have dimensions of the order of approximately 30 micrometers ($\mu m$).

According to a further embodiment, a method for manufacturing lead frames is provided wherein the screen printing mesh is made of metal, for example, of nickel, steel, or nickel-plated steel. Metals are particularly convenient since they can be patterned by photoengraving or by means of laser-based techniques so as to form the holes in the mesh. In particular, nickel is a particularly stable material. Furthermore, nickel can be easily patterned by means of laser-based techniques so as to form extremely fine meshes, for example, approximately 75 to 400 holes per square inch (1 square inch is equal to 6.4516 $cm^2$).

According to an embodiment, the nickel mesh has an approximate thickness of about over 80 $\mu m$ and includes a plurality of hexagonal holes having a dimension of approximately 27 $\mu m$ and an opening area of approximately 17%.

According to a further embodiment, a method for manufacturing lead frames is provided wherein the occlusion is achieved by means of gelatine.

According to a further embodiment, a method for manufacturing lead frames is provided further including the following steps: spreading the screen printing mesh with the gelatine so as to occlude the holes of the screen printing mesh, polymerization of the gelatine occluding one or more predetermined holes, stripping non-polymerized gelatine off the screen printing mesh so as to clear the holes occluded by non-polymerized gelatine.

According to a further embodiment, a method for manufacturing lead frames is provided wherein the delimitation includes the formation of a screening mask on the surface of the substrate and the screening mask is such that said one or more predetermined portions of the surface of the substrate are exposed so as to allow the coating layer to be deposited onto them. The screening mask allows, in an easy and effective way, delimiting those portions onto which the coating layer is to be deposited, for example, by plating.

According to a further embodiment, a method for manufacturing lead frames is provided wherein the screening mask includes one or more of the following materials: epoxy materials or acrylic materials.

According to a further embodiment, a method for manufacturing lead frames is provided that further includes curing of the screening mask. In this manner, the screening mask is steadily attached to the substrate and it is strengthened so as to prevent the material from being wasted due to leaks through gaps likely to occur between the mask and the substrate.

According to a further embodiment, a method for manufacturing lead frames is provided wherein curing is carried out by means of UV-radiation. Curing by means of UV-radiation is particularly effective with respect to material which can be used as screen printing ink.

According to a further embodiment, a method for manufacturing lead frames is provided that further includes stripping for removing the material deposited by means of screen printing from the substrate.

According to a further embodiment, a method for manufacturing lead frames is provided that further includes a substrate pre-treatment so as to remove impurities from the substrate, said pre-treatment being carried out before the predetermined areas of the substrate upon which the coating layer is to be formed, are delimited.

According to a further embodiment, a method for manufacturing lead frames is provided wherein the formation of at least a coating layer on one or more predetermined portions of the surface of the substrate includes plating with one or more metal layers. For example, metals such as nickel, palladium, gold, and silver can be plated.

According to a further embodiment, a method for manufacturing lead frames is provided wherein the coating layer includes one or more metals. For example, multi-layer coatings can be implemented which are particularly effective for guaranteeing high and stable solderability.

According to a further embodiment, an apparatus for manufacturing lead frames includes a screen printing press.

According to a further embodiment, an apparatus for manufacturing lead frames is provided wherein the screen printing press includes a rotary screen printing press.

According to a further embodiment, an apparatus for manufacturing lead frames is provided wherein the screen printing press includes a metallic screen printing mesh.

According to a further embodiment, an apparatus for manufacturing lead frames is provided wherein the metallic screen printing mesh includes at least one of the following materials: nickel, steel, nickel-plated steel. The screen printing mesh can have thickness approximately between 50 and 100 $\mu m$, for example, 80 $\mu m$.

According to a further embodiment, the screen printing mesh is made of nickel and includes a plurality of holes with regular hexagonal shape and a dimension of approximately between 25 μm and 30 μm, for example, 27 μm.

According to a further embodiment, at least one or more of the holes of the mesh are occluded by means of gelatine.

According to a further embodiment, an apparatus for manufacturing lead frames is provided further including a station for curing the material deposited by means of the screen printing press.

According to a further embodiment, an apparatus for manufacturing lead frames is provided wherein the curing station includes a system for irradiating UV-light.

According to a further embodiment, an apparatus for manufacturing lead frames is provided that is adapted to carry out a reel-to-reel process. Reel-to-reel processes enable fast and effective large-scale production of lead frames.

BRIEF DESCRIPTION OF THE DRAWINGS

One or more embodiments are described by referring to the attached figures, in which identical and/or similar and/or corresponding parts are identified by the same reference numbers or letters. In the figures.

DETAILED DESCRIPTION

In the following, one or more embodiments are described. However, the present disclosure is by no means limited to the particular one or more embodiments described in the detailed description below.

Figure 1:
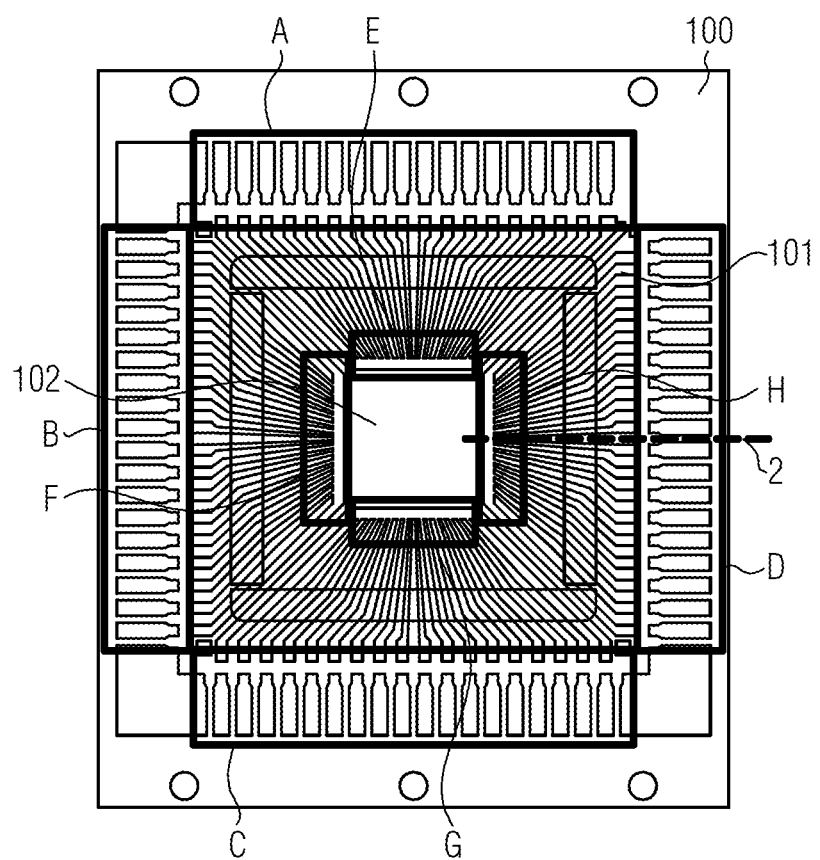
FIG. 1 is a plan view of a lead frame seen from above according to an embodiment.

FIG. 1 is a plan view of a lead frame 100, which can be obtained according to an embodiment. The lead frame 100 includes a plurality of conducting elements 101 and a housing area 102 adapted to house semiconductor devices such as, for example, chips and integrated circuits. The conducting elements 101 are used for electrically coupling the devices housed in the housing area 102 with, for example, other electronic systems in the architecture of a printed circuit board.

FIG. 1 shows those predetermined portions A, B, C, D, E, F, G, and H of the substrate of the lead frame 100 that are plated. In particular, in the example shown in FIG. 1, the ends of the conducting elements 101 are plated. The predetermined portions E, F, G and H correspond to the inner ends of the conducting segments 101, i.e. to the ends of the conducting elements facing the housing area 102. These ends are adapted to be electrically coupled, for example, by means of wire bonding, to the one or more devices housed in the housing area 102.

The predetermined portions A, B, C, and D correspond to the outer ends of the conducting elements 101, i.e. to the ends of the conducting elements 101 on the side opposite to the ends facing the housing area 102. These ends can, for example, be coupled by means of welding or soldering to other electronic systems in the architecture of a complex system.

As shown in FIG. 1, the predetermined portions A, B, C, D, E, F, G, and H identify a limited portion of the surface of the lead frame substrate and, therefore, enable the selective plating, i.e. restricted to those predetermined portions. In this manner, a considerable amount of material to be deposited for plating can be saved, with respect to methods based on full plating of the substrate. In particular, it is possible to save up to about 75% of material deposited for plating with respect to the configuration with full plating. This allows for considerably reducing the costs for lead frame manufacturing, especially in the case in which the material deposited for plating is one or more precious metals.

Figure 2:
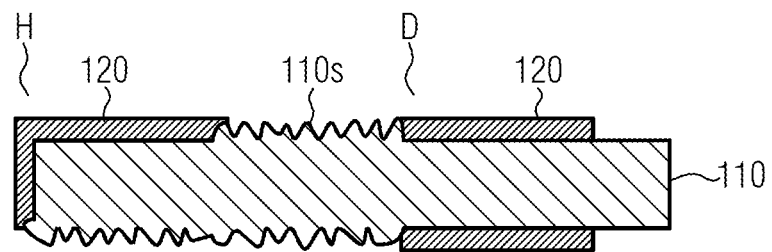
FIG. 2 is a cross section of the portion of the lead frame that corresponds to the dashed line shown in FIG. 1 according to an embodiment.

FIG. 2 schematically shows a cross section of that portion of the lead frame which corresponds to the dashed line shown in FIG. 1. For the sake of simplicity, FIG. 2 is not shown in scale with respect to FIG. 1.

FIG. 2 shows the metal substrate 110. The metal substrate 110 is also referred to as base metal. The substrate metal 110 can be made, for example, of copper, steel, iron, and nickel alloys, or nickel and steel alloys (invar). The substrate 110 includes a surface 110s.

As depicted in FIG. 2, some predetermined portions of the substrate 110 are coated with a coating layer 120. In particular, the predetermined portions coated with the coating layer shown in FIG. 2 correspond to areas H and D shown in FIG. 1.

The coating layer 120 can include a single metal layer. Alternatively, the coating layer 120 can include a multi-layer structure having one or more metal layers. Metals which can be used for the coating layer 120 can include, for example, one or more of the following materials: nickel, palladium, silver, gold, silver and gold alloys.

For example, a coating layer 120 can be implemented which includes a nickel layer in direct contact with the substrate 110, a palladium layer on top of the nickel layer, a silver layer on top of the palladium layer, and a gold layer on top of the silver layer. According to a further example, the coating layer 120 can include a nickel layer in direct contact with the substrate 110, a palladium layer on top of the nickel layer, and a gold layer on top of the palladium layer.

The areas of the surface 110s of the substrate 110 that are not plated, i.e. that are not coated by the coating layer 120, can also be rough as shown in FIG. 2 so as to improve, for example, adhesion with plastic materials or resins used for encapsulating the devices housed in the housing area 102 of the lead frame.

In particular, the substrate 110 can undergo a roughening process, for example by means of chemical, electrochemical or thermal processing, before carrying out the deposition of the coating layer 120. The substrate, thus roughened, subsequently undergoes the processes for forming the coating layer 120, which will be accurately described in what follows. During these processes, the areas screened by the screening mask remain unaltered and, thus, rough, whereas the areas exposed for receiving the coating layer 120 by plating are flattened, for example by the plating processes.

In this way, after carrying out the formation of the coating layer 120, the areas that are not coated by the coating layer 120 are rough as shown in FIG. 2, and are, therefore, particularly convenient for improving adhesion of the substrate 110 with encapsulating materials used for encapsulating the devices housed in the housing area 102.

Figure 3:
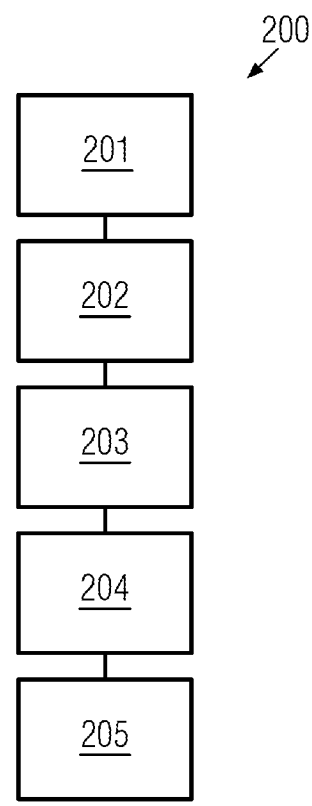
FIG. 3 is a flow chart of a method for manufacturing lead frames according to an embodiment.
Figure 4:
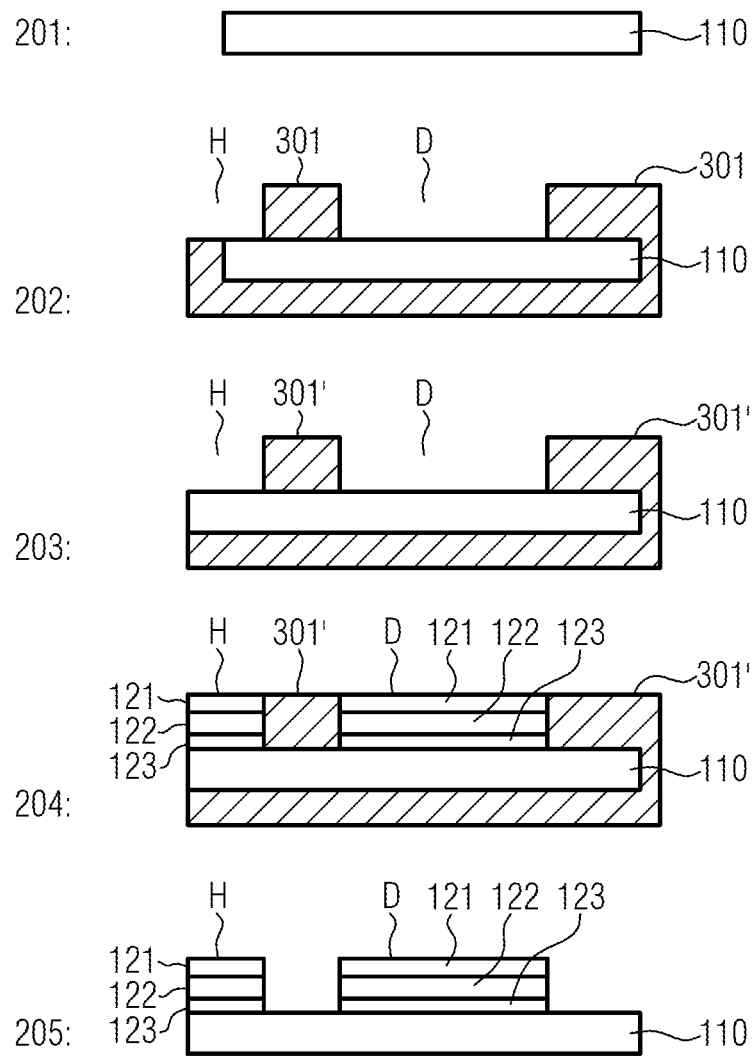
FIG. 4 is a diagram of the results of each single step of a method according to the flow-chart shown in FIG. 3 according to an embodiment.

FIG. 3 is a flow-chart of a method 200 for manufacturing lead frames according to an embodiment, and FIG. 4 is a diagram of the results of each step of the method according to the flow chart of FIG. 3.

In the first step 201 of the method 200, the pre-treatment of the metal substrate 110 is carried out. In particular, the metal substrate 110, which is pre-treated at step 201, has been previously patterned so as to form the lead frame structure. The metal substrate 110, which is pre-treated at step 201, thus includes the conducting segments and the housing area for housing the electronic devices. These structures can be obtained starting from a metal sheet by using known techniques, for example by means of punching and cutting.

The pre-treatment 201 allows the surface 110s of the substrate 110 to be cleaned, i.e. to be cleared of many or all possible contaminants on the surface. In particular, the pre-treatment allows for removing oxides and grease from the surface 110s of the substrate 110.

The pre-treatment 201 can include, for example, a bath for removing oil from the surface 110s of the substrate 110. Furthermore, the pre-treatment 201 can include electro-cleaning processes so as to remove organic compounds from the surface 110s of the substrate 110 and to reduce the roughness of the surface. Furthermore, the pre-treatment 201 can include chemical etching processes for removing oxides from the surface. Air blows and rinsing in water can also be applied to the substrate 110 before and after each process of the pre-treatment 201 for removing chemicals used in the process that might remain and for preventing the substrate from being contaminated again.

In the second step 202 of the method 200, those portions of the substrate 110 are delimited which are to be subsequently coated with the coating layer 120. Basically, in the second step 202 a selective coating is performed. In particular, in the second step 202 the screening mask 301 on the surface of the substrate 110 is formed. The screening mask 301 allows for delimiting the portions of the substrate upon which the coating layer 120 is to be subsequently formed. In particular, the screening mask 301 is such that it leaves the substrate portions upon which the coating layer 120 is to be subsequently formed exposed. As depicted in FIG. 4, the screening mask 301 is such as to leave the portions H and D of the surface of the substrate 110 exposed in an embodiment.

Furthermore, in the example shown in FIG. 4, the screening mask 301 covers also the entire lower surface of the substrate 110. This can be convenient, for instance, for so called Lead Tips of the lead frame, i.e. for the inner ends facing the housing area 102. These areas can be plated on one of the two surfaces only, in order to favor the subsequent wire bonding.

The screening mask 301 can be made of epoxy materials, acrylic materials, or a mixture of epoxy and acrylic materials.

The screening mask 301 is formed on the substrate 110 by means of screen printing. An example of the formation process of the screening mask 301 according to an embodiment is described in detail below.

In the third step 203 of the method 200, curing of the material deposited on the substrate 110 by means of screen printing at step 202 is performed. In particular, as shown in the example depicted in FIG. 4, curing of the screening mask 301 formed by means of screen printing at step 202 is performed so as to form the cured screen printing mask 301'.

Curing can be achieved by exposing the system to ultraviolet radiation. For example, the system can be exposed to radiation with a wavelength of approximately 300 nm or smaller. The system can be exposed for approximately 3-5 seconds to a radiation of about 350 mJ/cm$^2$.

In the fourth step 204 of the method 200, plating is carried out. In particular, in the fourth step 204 the formation of the coating layer 120 is carried out. This can be achieved by means of known techniques, for example by means of electrodeposition.

In the example shown in FIG. 4 the coating layer 120 includes three layers: 121, 122, and 123. The three layers can be sequentially obtained by means of subsequent depositions by electrodeposition. The layer 123 in direct contact with the substrate 110 can be, for example, a nickel layer. The layer 122 on top of the layer 123 can be a palladium layer. The layer 121 on top of the palladium layer can be a gold layer.

In the fifth step 205 of the method 200, stripping off of the cured material formed in steps 202 and 203 is carried out. The cured screening mask 301' can be removed by means of, for example, alkali solutions. For instance, an approximately 3% solution of sodium hydroxide can be used.

In the following, the delimitation 202 of one or more predetermined portions of the substrate 110 by means of screen printing will be described in detail according to an embodiment.

The screen printing press includes a screen printing mesh. The screen printing mesh defines the areas through which the material acting as screen printing ink can penetrate. Therefore, the screen printing mesh reflects the substrate areas which are screened by the mask obtained by screen printing.

The screen printing mesh can include a very fine net having a plurality of holes with the same shape and dimensions. The dimensions of the holes can vary in the approximate range from a few tens to a few hundreds of µm. For example, the holes can have a diameter approximately of the order of 30 µm, for instance approximately 27 µm.

The screen printing mesh can be made, for example, of steel, nickel-plated steel, nickel, or polyester. Metallic materials are particularly convenient since they can easily be photoengraved or engraved by means of laser-based techniques so as to obtain extremely fine meshes, for example approximately 75 to 400 holes per square inch. Furthermore, metallic materials are such that their thicknesses do not affect the dimensions of the hole opening.

The screen printing mesh can, thus, be produced starting from a metal sheet that is patterned by laser-based techniques so as to obtain a predefined mesh.

The screen printing mesh can be conveniently implemented in nickel. Nickel enables extremely small holes. Furthermore, nickel is a particularly stable material. For instance, holes with dimension of approximately 27 µm can be obtained. The holes can have a hexagonal shape. For example, the holes can have a regular hexagonal shape. In this case, the hexagonal holes can be such that the diameter of the circle inscribed in the hexagon is of the order of approximately 30 µm, for instance approximately 27 µm.

The nickel sheet can have, for example, a thickness of approximately 80 µm.

The opening area, i.e. the ratio of total surface occupied by the holes to total surface of the mesh, can be approximately 17%.

Predetermined areas of the screen printing mesh are occluded by means of gelatines. For example, emulsions or photosensitive products can be used. In particular, the gelatines can include photosensitive acrylic or epoxy polymer-matrices. The gelatines can be such that, after being photopolymerized, they are resistant to inks used in screen printing so as not to be damaged or removed by the presence of the screen printing inks.

Basically, some predetermined holes of the mesh are occluded with gelatine. In this manner, the positive image of the coating structure 120 to be deposited on the lead frame is obtained on the screen printing mesh. In other words, those holes of the screen printing mesh are occluded with gelatine, which correspond to the regions of the lead frame that are to be exposed so that the coating layer 120 can be deposited upon them, for example by means of plating.

The photosensitive gelatine in semi-liquid form can be spread across the whole surface of the screen printing mesh by means of a roller or squeegee. In this manner, the semi-liquid gelatine homogeneously occupies all holes in the screen printing mesh. The system is subsequently exposed to a light beam, for example to ultraviolet radiation, after being covered by an appropriately designed mask so as to leave exposed only those portions of gelatine which are to be polymerized and, thus, made stable by means of the light beam. After exposing the system covered by the mask to the light beam, the gelatine occupying the holes corresponding to openings in the mask is polymerized. Conversely, the gelatine occupying the holes covered by the mask during the exposure to the light beam is not polymerized. This residual non polymerized gelatine is then removed by means of aqueous solutions or solvents. In this manner, the holes of the screen printing mesh with non polymerized gelatine are cleared of the gelatine and, thus, opened. The holes of the screen printing mesh with polymerized gelatine are, conversely, still occluded since polymerized gelatine is not removed by the aqueous solutions used for removed non polymerized gelatine.

The polymerized gelatine stays therefore steadily in the holes of the screen printing mesh. In order to change the image produced and, thus, to modify the shape and/or the dimensions of the coating structure 120, one modifies the screen printing mesh, for example, by removing the polymerized gelatine or by replacing the screen printing mesh with a new one. Polymerized gelatine can be removed from the holes by means of stripping with appropriate solvents, for example, chlorinated solvents.

The material making up the screening mask acts as ink for screen printing. Typical materials which can be used as screen printing ink according to an embodiment include epoxy materials, acrylic materials, or materials formed by a mixture of epoxy and acrylic materials. Additives can also be added, so as to adjust the rheology of the ink. Furthermore, additives can be added to serve as photo-initiators.

The screen printing ink is then let through the screen printing mesh. Basically, the screen printing ink is pushed so as to let it through only those holes that are not occluded by gelatine. In this manner, the negative image of the coating structure 120 to implement is produced on the lead frame. In other words, the screen printing ink is deposited on the lead frame substrate so as to leave exposed those areas of the substrate upon which the coating structure is to be formed. The screen printing ink forms, therefore, the screening mask 301 on the lead frame substrate.

According to an embodiment, the screen printing is of a rotary type. In this case, a screen printing mesh as described above is mounted onto the printing roller. The printing roller is hollow and is filled with screen printing ink. The printing roller can be provided with a squeegee roller adapted to force the screen printing ink through the non occluded holes of the screen printing mesh.

One or more substrates of lead frame placed on a dedicated belt are slid across the roller surface. In particular, the system can be provided with a press roller so that the belt supporting the substrate is pressed against the surface of the press roller. In particular, the belt supporting the lead frame substrate is lead between the printing and the press roller.

When the substrate is in contact with the surface of the roller, the ink is let out of the screen printing mesh so as to form the screening mask on the substrate.

Active control on the motion of the press roller allows, for example, for compensating misalignments that may occur between the reproduction step of the desired image and the lead frame substrates on the belt.

Figure 5:
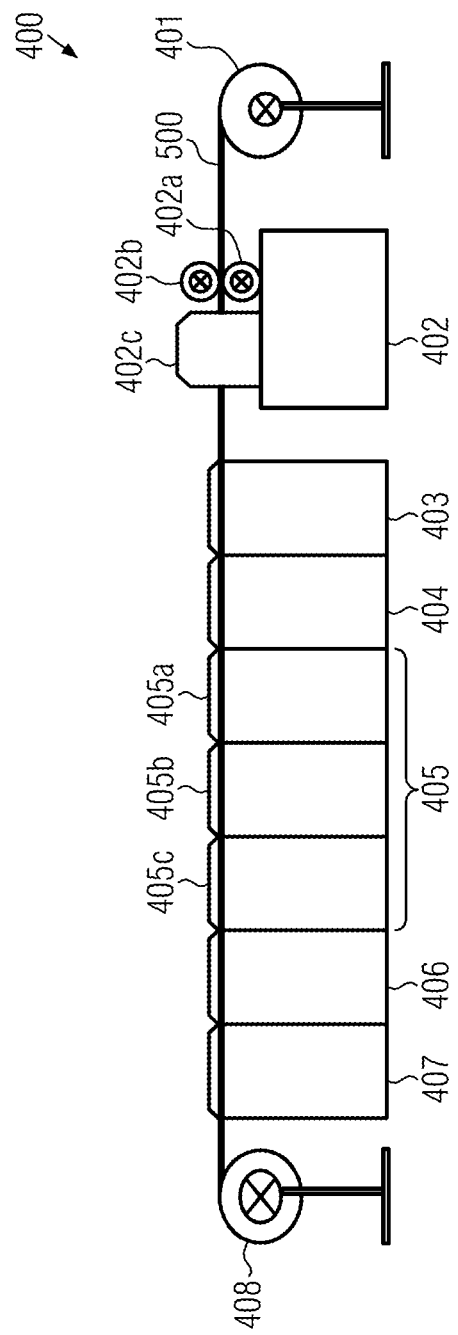
FIG. 5 is a diagram of an apparatus according to an embodiment.

FIG. 5 is a diagram of an apparatus 400 for producing lead frames according to an embodiment.

The system is adapted to carry out a reel-to-reel process. In particular, the system includes a supply reel 401. The supply reel 401 is loaded with a belt 500 upon which the lead frame substrates are mounted.

The belt 500 is driven from the supply reel 401 to the station 402 for the delimitation 202 of the predetermined portions of the substrate upon which the coating layer is to be formed. In particular, the station 402 includes a screen printing press. In the example shown in FIG. 5, the screen printing press is a rotary screen printing press, whose cylinder 402*b* and press roller 402*a* are schematically depicted.

The station 402 also includes a station 402*c* for curing the material deposited on the lead frame substrate by the screen printing press. For example, the station 402*c* for curing can include a system for ultraviolet radiation.

At the station 402, therefore, the cured mask 301' is formed on the lead frame substrate.

The belt 500, from the station 402, reaches subsequently the cleaning station 403. At this station the substrate is cleaned. In particular, the exposed areas, upon which the coating layer 120 will be deposited, are cleaned. For example, at this station residual oily impurities or organic contaminants of the substrate can be removed. This cleaning procedure is carried out with substances adapted to not corrode or damage the cured masked 301'. For instance, the station 403 may use substances with pH less than about 10.

From the cleaning station 403, the belt is sent to the activation station 404. At this station, the substrate is cleared of oxides which might form, for example of copper oxides in case of a copper substrate. Furthermore, a thin layer film of substrate material can be removed by chemical etching, so as to expose the layers of material underneath, which are more active and, thus, facilitate the subsequent plating. Activation can be achieved, for example, by means of acid solutions and selective oxidizing agents for the material of which the substrate is made.

Subsequently, the belt 500 is moved to the plating block 405. The plating block 405 is used for forming the coating layer 120. The plating block 405 can include one or more stations for plating, each station being adapted to perform plating with a specific type of metal. The plating stations can be adapted to perform, for example, plating by electrodeposition. In the example shown in FIG. 5, the plating block 405 includes three stations for plating: 405*a*, 405*b* and 405*c*. The station 405*a* can, for example, be adapted to perform plating with nickel. The station 405*b* can, for example, be adapted to perform plating with palladium. The station 405*c* can be adapted to perform plating with gold and/or silver.

After plating at the block 405, the belt 500 moves to stripping 406. At this station, the material deposited on the substrate by means of screen printing at block 402 is removed.

After stripping at the station 406, the belt reaches the station for drying 407. Drying conveniently removes residual traces of water which might persist from the system. In particular, this residual water might oxidize the substrate, thus damaging its properties by forming, for example, discolorations.

Finally, the belt 500, which at this stage carries the completed lead frames, is wound by the take-up-reel 408.

Although not explicitly shown in FIG. 5, cleaning means for removing residual impurities, which might result from the previous station can be present between the pairs of indicated stations. For instance, the system 400 may carry out one or more rinses after each station. Furthermore, the system 400 may further clean itself, or may further be cleaned, after each station with an air blow.

Furthermore, after stripping at the station 406, the system 400 may include a high-pressure wash so as to facilitate removing the cured mask 301'.

The reel-to-reel system 400 with a screen printing press allows for considerably increasing the lead-frame production rate According to an embodiment. For example, production rates of approximately 10-30 m/min can be achieved. It may also be possible to achieve production rates of approximately 50 m/min. At the same time, lead frames thus manufactured typically have excellent electronic and structural properties.

Although the present disclosure references the one or more embodiments presented above, it is clear to the skilled person that several modifications, variations or improvements according to the teachings described above can be designed, without departing from the scope of the disclosure.

For example, although it has been shown that the predetermined lead-frame areas upon which the coating is formed are the ends of the lead frame conducting elements, it may be possible to choose these predetermined areas in any position of the substrate.

Furthermore, according to an embodiment, it may also be possible to structure the coating layer so that it is formed by a plurality of metal layers with different shapes. In particular, it may be possible to form a first coating layer by plating after making a first screening mask by screen printing. After forming the first coating layer, it may be possible to remove the first screening mask by stripping and to make, by screen printing, a second screening mask with a different structure from the first mask so as to form a second coating layer with, for example, dimensions and/or shapes different from the first coating layer. This procedure can be repeated several times so as to form a multi-layer coating wherein each layer has specific dimensions and/or shapes that can be, for example, different from those of the other layers.

Furthermore, even though in the examples shown above a treatment with a single belt (single-strand treatment) has been described, it may also be possible to work with two or more than two belts in parallel (double strand, multiple strands treatment). In this manner, the lead-frame production rate is further accelerated.

In addition to that, areas that are known to the skilled person have not been described in order to avoid any unnecessary complication when describing the one or more embodiments above.

Consequently, the embodiments described above are not meant to be restrictive or limiting.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
   a screen printing mesh;
   a screen printing device configured to form a mask over portions of an upper surface of an object by causing a masking agent to pass through the screen printing mesh and to form the mask over an entire lower surface of the object;
   wherein the screen printing device includes a roller having an outer surface;
   wherein the screen printing mesh is disposed over the outer surface of the roller; and
   wherein the screen printing device is configured to cause the masking agent to flow from the outer surface of the roller, through the screen printing mesh, and over the upper surface of the object.

2. The apparatus of claim 1 wherein:
   the screen printing mesh includes,
      a passing region configured to pass the masking agent; and
      a blocking region configured to block the masking agent; and
   the screen printing device is configured to form the mask by causing the masking agent to pass through the passing region of the member and over portions of the object.

3. The apparatus of claim 2 wherein the screen printing mesh includes:
   the passing region includes openings configured to pass the masking agent; and
   the blocking region includes occluded openings configured to block the masking agent.

4. The apparatus of claim 1 wherein the screen printing device is configured to align the screen printing mesh with the object.

5. The apparatus of claim 1 wherein the screen printing device is configured to form the mask by curing the passed masking agent.

6. The apparatus of claim 1 wherein the masking agent includes an ink.

7. The apparatus of claim 1, wherein the screen printing device further comprises a conveyor configured to carry the object to the screen printing mesh.

8. The apparatus of claim 1, wherein the screen printing device is further configured to form a coating over portions of the object exposed by the mask.

9. The apparatus of claim 8, wherein the coating comprises an electrically conductive coating.

10. The apparatus of claim 9, wherein the electrically conductive coating comprises a multi-layered conductive coating.

11. The apparatus of claim 10, wherein the screen printing device is further configured to remove the mask from the object.

12. The apparatus of claim 1 wherein the object is a lead frame.

13. The apparatus of claim 1 wherein the screen printing mesh comprises a metal screen printing mesh.

14. The apparatus of claim 13 wherein the metal screen printing mesh comprises a plurality of holes having a density of approximately 75 to 400 holes per square inch.

15. A method, comprising:
flowing a masking agent through a screen printing mesh;
forming a mask on an upper surface of a lead frame with the flowed masking agent;
forming the mask to cover an entire lower surface of the lead frame,
wherein flowing the masking agent includes,
flowing the masking agent out of a surface of a roller and through the screen printing mesh, which is disposed over the surface of the roller, and
rotating the roller; and
wherein forming the mask includes,
moving the lead frame by the roller, and
receiving the masking agent from the screen printing mesh with the moving lead frame.

16. The method of claim 15 wherein flowing the masking agent includes flowing the masking agent through openings in the screen printing mesh.

17. The method of claim 16, wherein flowing the masking agent includes,
flowing the masking agent through unblocked openings in the screen printing mesh; and
blocking the masking agent with blocked openings in the screen printing mesh.

18. The method of claim 15 wherein forming the mask includes curing the masking agent.

19. The method of claim 18, further comprising forming a coating over portions of the lead frame exposed by the mask.

20. The method of claim 19, further comprising removing the mask from the lead frame.

21. The method of claim 15, further comprising plating portions of the upper surface of the lead frame exposed by the mask to form on each of these exposed portions of the lead frame a multi-layer structure including one or more metal layers.

* * * * *